(12) United States Patent
Becker et al.

(10) Patent No.: US 7,730,611 B2
(45) Date of Patent: Jun. 8, 2010

(54) HIGH CAPACITY PICK AND PLACE PROCESS

(75) Inventors: Ulf Becker, Alpharetta, GA (US); David Halk, Cummings, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 216 days.

(21) Appl. No.: 12/052,948

(22) Filed: Mar. 21, 2008

(65) Prior Publication Data

US 2008/0240893 A1 Oct. 2, 2008

Related U.S. Application Data

(60) Provisional application No. 60/908,775, filed on Mar. 29, 2007.

(51) Int. Cl.
*H05K 3/30* (2006.01)
*H01L 21/70* (2006.01)

(52) U.S. Cl. ............... 29/832; 29/825; 438/400; 438/464

(58) Field of Classification Search ........... 29/825, 29/830, 832; 438/460, 464
See application file for complete search history.

(56) References Cited

U.S. PATENT DOCUMENTS

| | | | |
|---|---|---|---|
| 4,759,675 A * | 7/1988 | Bond et al. | 29/825 |
| 4,915,565 A * | 4/1990 | Bond et al. | 29/740 |
| 6,165,232 A * | 12/2000 | Tieber et al. | 29/25.01 |
| 2005/0064683 A1* | 3/2005 | Farnworth et al. | 438/464 |
| 2006/0013680 A1 | 1/2006 | Haba et al. | 414/935 |

FOREIGN PATENT DOCUMENTS

| | | |
|---|---|---|
| DE | 4433509 A1 | 4/1995 |
| DE | 202005011948 | 10/2005 |
| FR | 2613175 A1 | 9/1988 |
| GB | 1141075 A | 1/1969 |

OTHER PUBLICATIONS

International Search Report dated Oct. 6, 2008 for Application No. PCT/US2008/003825.

* cited by examiner

*Primary Examiner*—C. J Arbes
(74) *Attorney, Agent, or Firm*—Frank J. Nuzzi

(57) ABSTRACT

A method of accurately placing an object with a pick and place machine provides raw material. A desired surface topography is created in the raw material. The raw material is diced into parts using a bevel cut so that each of the parts has bevel surfaces. A fixture is provided that has a plurality of spaced cavities with each cavity having bevel surfaces constructed and arranged to mate with the bevel surfaces of an associated part. A pick and place machine picks and places each part into an associated cavity such that the bevel surfaces of the part mates with the bevel surfaces of the cavity.

20 Claims, 4 Drawing Sheets

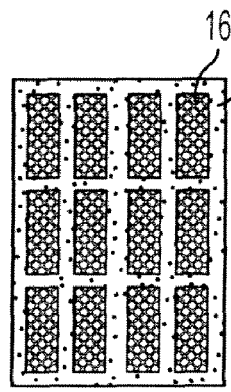
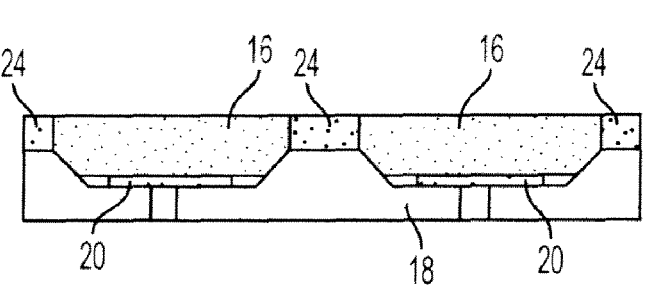
FIG. 11   FIG. 12
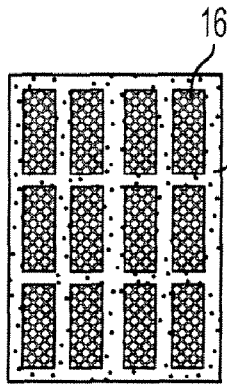
FIG. 13
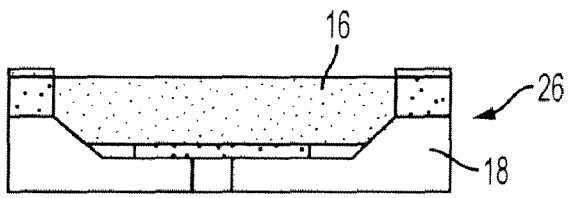
FIG. 14
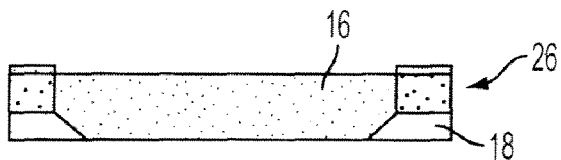
FIG. 15

HIGH CAPACITY PICK AND PLACE PROCESS

This application claims the benefit of the earlier filing date of U.S. Provisional Application No. 60/908,775, filed on Mar. 29, 2007, which is hereby incorporated by reference into this specification.

FIELD OF THE INVENTION

The invention relates to pick and place machines for placing an object at a location and, more particularly, to a process that employs a pick and place machine to place raw material with high speed and accuracy.

BACKGROUND OF THE INVENTION

Conventional pick and place machines are used to pick and place parts of an assembly. Currently, there are no conventional component type pick and place machines used in making semiconductors that can place an object within a few microns, with the object staying in that precise location.

There is a need to be able to use conventional pick and place machines to pick and place raw material with high speed and an accuracy of a few microns.

SUMMARY OF THE INVENTION

An object of the invention is to fulfill the need referred to above. In accordance with the principles of the present invention, this objective is obtained by providing a method of accurately placing a part during a manufacturing process. The method provides raw material. A desired surface topography of the raw material is created. The raw material is diced into parts using a bevel cut so that each of the parts has bevel surfaces. A fixture is provided having a plurality of spaced cavities. Each cavity has bevel surfaces constructed and arranged to mate with the bevel surfaces of an associated part. Each part is placed into an associated cavity such that the bevel surfaces of each part mate with the bevel surfaces of the cavity.

In accordance with another aspect of the disclosed embodiment, a method of accurately placing a part with a pick and place machine mounts raw material onto a silicon wafer frame. The raw material is structured to create a certain surface topography. The raw material is flipped and transferred onto adhesive tape such that the structured portion of the raw material engages the adhesive tape. The raw material is diced into parts using a bevel cut so that each of the parts has bevel surfaces. A fixture is provided having a plurality of spaced cavities with each cavity having bevel surfaces constructed and arranged to mate with the bevel surfaces of an associated part. A pick and place machine picks, flips and places each part into an associated cavity such that the bevel surfaces of each part mate with the bevel surfaces of the associated cavity. Each part is surrounded with adhesive to build a base for the part. The adhesive is cured to define a structure. A lithography process is applied to build up metallization on the structure. The structure is then diced to define individual pieces.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which:

FIG. 11 shows the step of surrounding each part 16 with adhesive to build a base.

FIG. 12 is an enlarged side view of a portion FIG. 11, showing the adhesive surrounding each part.

FIG. 13 shows the step of curing the adhesive of FIG. 11 and then applying a lithography process to build-up metallization.

FIG. 14 shows a diced-up piece of FIG. 13 left with the wafer/silicon backing

FIG. 15 shows the diced-up piece of FIG. 13 thinned from the backing.

DETAILED DESCRIPTION OF THE EXEMPLARY EMBODIMENT

The embodiment provides a high speed pick and place process with enough capacity to meet a desired throughput, without the need to reduce the final placement accuracy of components. The process described below provides the ability to use conventional pick and place machines to pick and place parts of raw material with high speed and an accuracy of a few microns, with the part staying in the precise location during the process.

Figure 1:
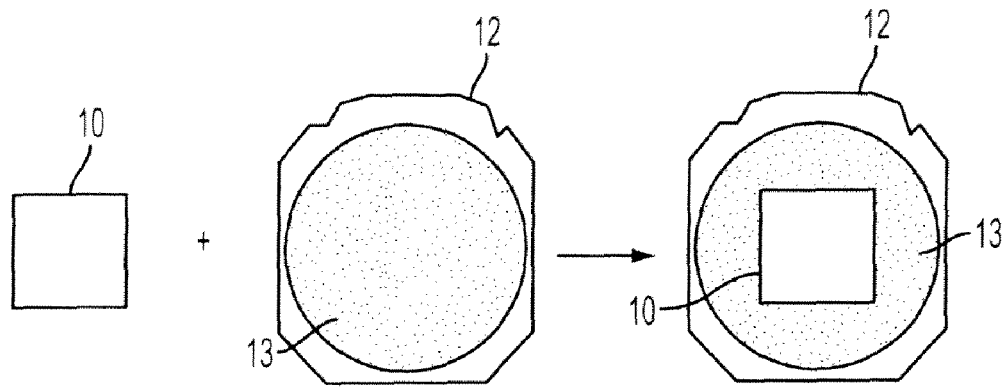
FIG. 1 shows a step of mounting raw material onto a wafer frame using UV tape in accordance with an embodiment of the invention.
Figure 2:
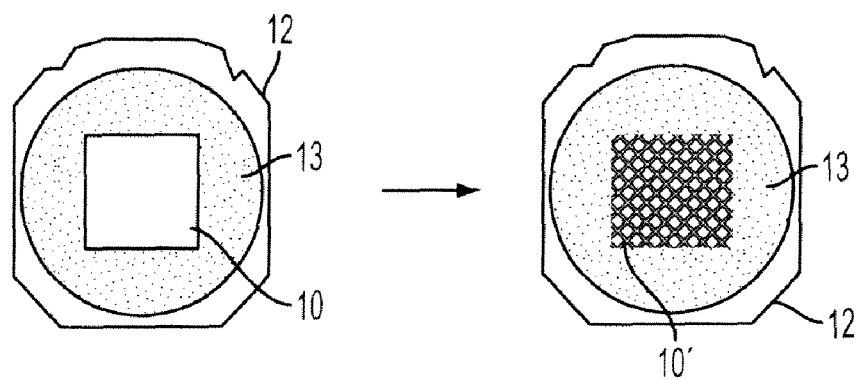
FIG. 2 shows the step of structuring the raw material of FIG. 1 to create a desired surface topography of the raw material.

With reference to FIG. 1, in a process of making a semiconductor, raw material 10 is mounted onto a silicon wafer frame 12 using UV tape 13. The raw material can be any material but, in the embodiment, the raw material 10 is electrically conductive material. Thus, the raw material 10 is placed on the tape 13. In FIG. 2, the raw material 10 is structured to create the desired surface topography of the raw material 10'.

Figure 3:
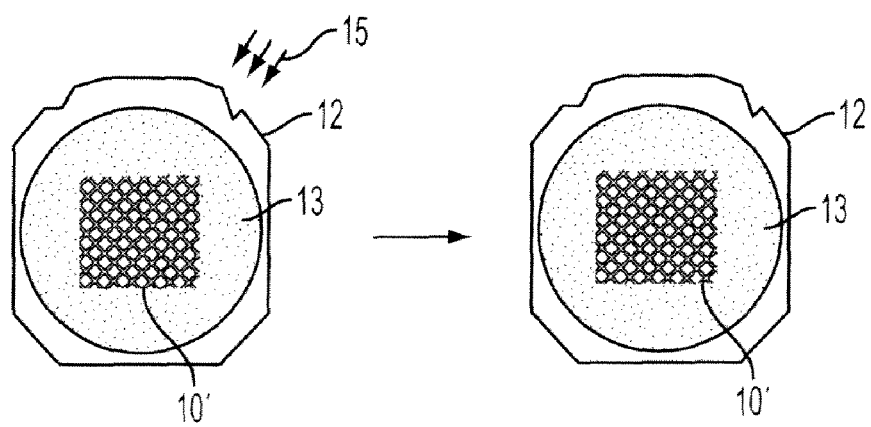
FIG. 3 shows the step of exposing the UV tape of FIG. 2 to UV light to reduce the level of tackiness thereof.
Figure 4:
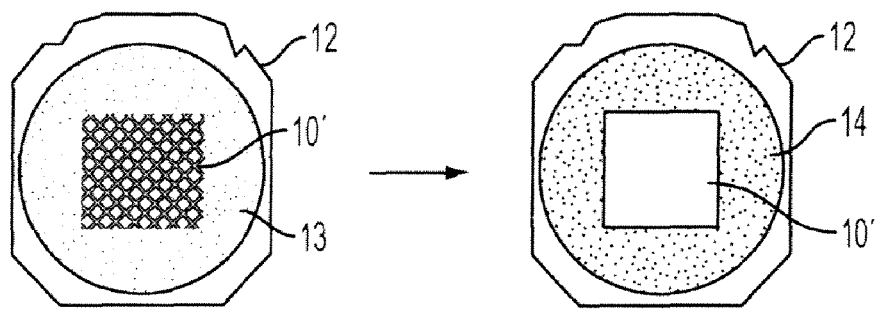
FIG. 4 shows the step of flipping the entire piece of raw material of FIG. 3 and transferring it onto blue tape.
Figure 5:
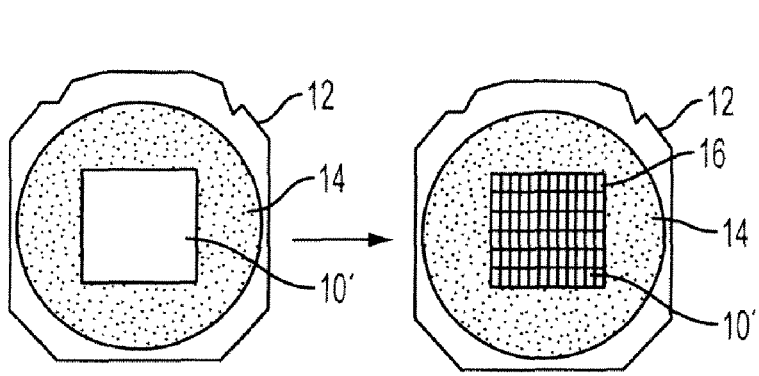
FIG. 5 shows the step of dicing of the transferred material of FIG. 4 into parts using a bevel cut to define bevel surfaces.
Figure 5A:
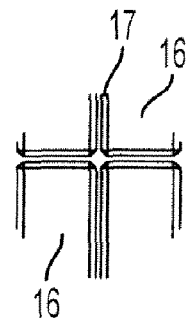
FIG. 5A is an enlarged view of the bevel surfaces of certain parts shown in FIG. 5.

FIG. 3 shows the UV tape 13 exposed to UV light 15 to reduce the level of tackiness of the tape 13. As shown in FIG. 4, the entire piece of raw material 10' is flipped and transferred onto conventional adhesive tape, such as blue tape 14, so that the structured portion of the raw material 10' engages the blue tape 14. FIG. 5 shows the step of dicing of the transferred material 10' into, for example, 1.1×12 mm parts 16. FIG. 5A shows an enlarged view of certain parts 16, preferably made using a bevel cut to define bevel surfaces 17. Since the part is rectangular, each side of each part 16 has a bevel surface 17.

Figure 6:
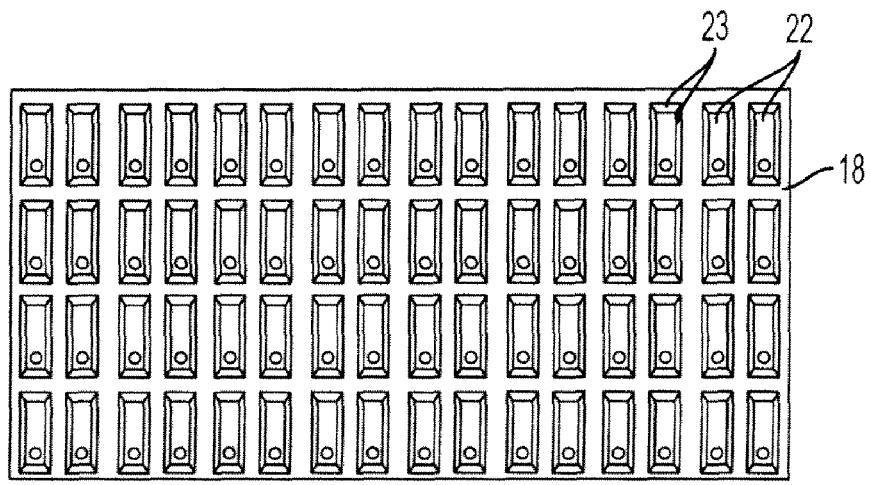
FIG. 6 shows a fixture providing correct spacing for a lithography process in accordance with an embodiment of the invention.

With reference to FIG. 6, a highly accurate fixture 18 provides the correct spacing for a lithography process. The fixture 18 is preferably made of silicon material in a wafer process, with a plurality of cavities 22 etched into the fixture 18. The cavities 22 preferably have bevel surfaces 23 that mate with precision (and self-align) with the bevel surfaces 17 of an associated part 16. More particularly, each side of the rectangular cavity 22 has a bevel surface 23 that mates with an associated bevel surface 17 of a part 16.

Figure 7:
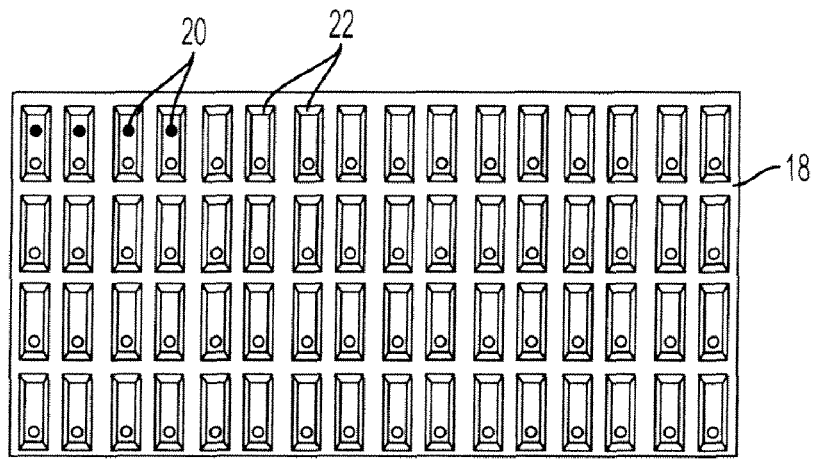
FIG. 7 shows a step of providing a dot of adhesive in the cavities of the fixture of FIG. 6.
Figure 8:
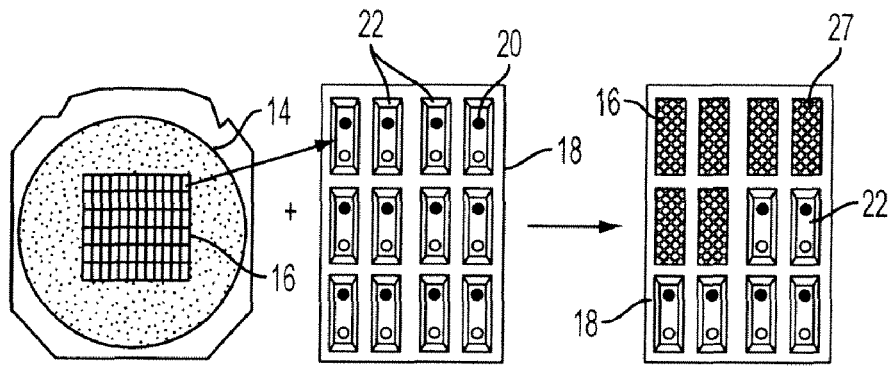
FIG. 8 shows the step of picking, flipping and placing each individual part into an associated cavity of the fixture of FIG. 7.

FIG. 7 shows the step of providing a dot of adhesive 20 to the bottom of each cavity 22 of the fixture 18 for stability. FIG. 8 shows the step of picking, flipping and placing (with a conventional high-speed pick and place machine 27) each individual part 16 into an associated cavity 16 of the fixture 18.

Figure 9:
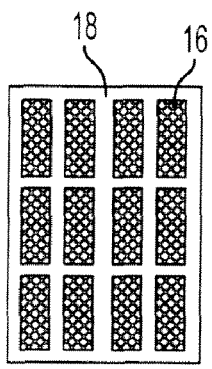
FIG. 9 shows the fixture of FIG. 7 with each cavity filled with a part.
Figure 10:
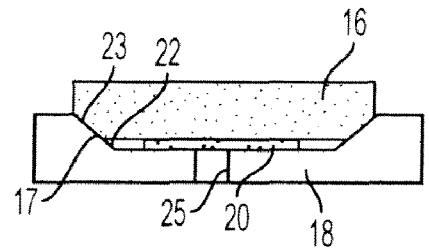
FIG. 10 is an enlarged side view showing how the fixture of FIG. 7, with the cavities, dictates the precise position of each part.

With reference to FIGS. 9 and 10, it can be appreciated that the that the fixture 18, with cavities 22, dictates the precise position of each part 16 due to the mating bevel surface configuration 23 and 17.

FIG. 11 shows each part 16 surrounded by adhesive 24 to build a base for, for example, a 2.2×12 mm part. FIG. 12 is an enlarged side view of a portion of the part 16, adhesive 24 and frame 18 of FIG. 11. FIG. 13 shows the step of curing the adhesive 24 and then applying a lithography process to build-up metallization on the structure 29. Thereafter the individual pieces 26 can be diced-up from the structure 29 and be employed in another process.

With reference to FIG. 14, the diced-up piece 26 can be left with the wafer/silicon backing 18 or the backing 18 can be thinned as shown in FIG. 15.

Thus, the disclosed process builds-up the essential components of a semiconductor by using a combination of wafer level process (front end) and dispensing/placement process (back end). The process advantageously enables a conventional pick and pace machine to place pieces of raw material with high speed and an accuracy of a few microns with the pieces remaining in a placed location.

Although the process was described in the making of semiconductors, it can be appreciated that the process can be used with conventional pick an place machines where precise positioning of raw material is required.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A method of accurately placing a part during a manufacturing process, the method including:
   providing raw material,
   creating a desired surface topography of the raw material,
   dicing the raw material into parts using a bevel cut so that each of the parts has bevel surfaces,
   providing a fixture having a plurality of spaced cavities, each cavity having bevel surfaces constructed and arranged to mate with the bevel surfaces of an associated part, and
   placing each part into an associated cavity such that the bevel surfaces of each part mate with the bevel surfaces of the cavity.

2. The method of claim 1, wherein the steps are performed sequentially.

3. The method of claim 2, wherein after providing the raw material, the method includes mounting the raw material onto a silicon wafer frame.

4. The method of claim 3, wherein the mounting step includes using UV tape.

5. The method of claim 4, wherein after the creating step, the method includes exposing the UV tape to UV light.

6. The method of claim 5, wherein after the exposing step, the method includes flipping the raw material over and transferring the raw material onto adhesive tape so that the structured portion of the raw material engages the adhesive tape.

7. The method of claim 1, wherein the dicing step includes dicing the raw material into a plurality of parts having a size of about 1.1×12 mm, with each side of each part having a bevel surface.

8. The method of claim 7, wherein each cavity is rectangular, with each side having a bevel surface.

9. The method of claim 1, wherein the placing step includes using a pick and place machine, to pick, flip and place the part into the cavity.

10. The method of claim 2, wherein prior to the placing step, the method includes applying adhesive to a bottom of each cavity.

11. The method of claim 2, wherein after the placing step, the method includes surrounding each part with adhesive to build a base for each part.

12. The method of claim 11, wherein after the surrounding step, the method includes curing the surrounding adhesive to define a structure, applying a lithography process to build up metallization on the structure and then performing additional dicing to define individual pieces of the structure.

13. A method of accurately placing a part with a pick and place machine, the method including the sequential steps of:
   mounting raw material onto a silicon wafer frame,
   structuring the raw material to create a certain surface topography,
   flipping and transferring the raw material onto adhesive tape such that the structured portion of the raw material engages the adhesive tape,
   dicing the raw material into parts using a bevel cut so that each of the parts has bevel surfaces,
   providing a fixture having a plurality of spaced cavities, each cavity having bevel surfaces constructed and arranged to mate with the bevel surfaces of an associated part,
   using a pick and place machine to pick, flip and place each part into an associated cavity such that the bevel surfaces of each part mate with the bevel surfaces of the associated cavity,
   surrounding each part with adhesive to build a base for the part,
   curing the adhesive to define a structure,
   applying a lithography process to build up metallization on the structure, and
   dicing the structure to defined individual pieces.

14. The method of claim 13 wherein the mounting step includes using UV tape.

15. The method of claim 14, wherein after the structuring step, the method includes exposing the UV tape to UV light.

16. The method of claim 13, wherein the dicing step includes dicing the raw material into a plurality of parts having a size of about 1.1×12 mm, with each side of each part having a bevel surface.

17. The method of claim 16, wherein each cavity is rectangular, with each side having a bevel surface.

18. The method of claim 13, wherein prior to the placing step, the method includes applying adhesive to a bottom of each cavity.

19. The method of claim 13, wherein after dicing the structure, the method further includes trimming the wafer frame.

20. The method of claim 13, wherein the mounting step includes mounting an electricity conductive material as the raw material.

* * * * *